US007316772B2

(12) United States Patent
Commander et al.

(10) Patent No.: US 7,316,772 B2
(45) Date of Patent: Jan. 8, 2008

(54) DEFECT REDUCTION IN ELECTRODEPOSITED COPPER FOR SEMICONDUCTOR APPLICATIONS

(75) Inventors: John Commander, Old Saybrook, CT (US); Richard Hurtubise, Clinton, CT (US); Vincent Paneccasio, Madison, CT (US); Xuan Lin, New Haven, CT (US); Kshama Jirage, Branford, CT (US)

(73) Assignee: Enthone Inc., West Haven, CT (US)

( * ) Notice: Subject to any disclaimer, the term of this patent is extended or adjusted under 35 U.S.C. 154(b) by 299 days.

(21) Appl. No.: 10/091,106

(22) Filed: Mar. 5, 2002

(65) Prior Publication Data

US 2003/0168343 A1      Sep. 11, 2003

(51) Int. Cl.
*C25D 5/02*      (2006.01)
*C25D 3/38*      (2006.01)

(52) U.S. Cl. .................. 205/123; 205/118; 205/296
(58) Field of Classification Search ............. 205/118, 205/123, 296; 106/1.26
See application file for complete search history.

(56) References Cited

U.S. PATENT DOCUMENTS

| | | | | |
|---|---|---|---|---|
| 3,770,598 A | * | 11/1973 | Creutz ..................... | 205/296 |
| 3,956,078 A | * | 5/1976 | Kardos et al. ............. | 205/296 |
| 4,110,176 A | * | 8/1978 | Creutz et al. ............. | 205/296 |
| 4,336,114 A | | 6/1982 | Mayer et al. | |
| 4,376,685 A | | 3/1983 | Watson | |
| 4,555,315 A | * | 11/1985 | Barbieri et al. ............ | 205/296 |
| 5,972,192 A | * | 10/1999 | Dubin et al. .............. | 205/101 |
| 6,129,830 A | | 10/2000 | Senge et al. | |
| 6,425,996 B1 | | 7/2002 | Dahms et al. | |
| 6,444,110 B2 | * | 9/2002 | Barstad et al. ............. | 205/123 |
| 6,673,216 B2 | * | 1/2004 | Pedersen et al. ........... | 204/212 |
| 2002/0043467 A1 | | 4/2002 | Morrissey et al. | |
| 2002/0043468 A1 | | 4/2002 | Mikkola et al. | |
| 2002/0053519 A1 | | 5/2002 | Morrissey et al. | |
| 2002/0074231 A1 | | 6/2002 | Mikkola et al. | |
| 2002/0088713 A1 | | 7/2002 | Merricks et al. | |
| 2002/0090484 A1 | | 7/2002 | Merricks et al. | |
| 2002/0127847 A1 | | 9/2002 | Alling et al. | |
| 2006/0183328 A1 | * | 8/2006 | Barstad et al. ............. | 438/687 |

FOREIGN PATENT DOCUMENTS

DE        2610705 A        2/1978

OTHER PUBLICATIONS

Declaration of Richard Hurtubise dated Dec. 21, 2004 (3 pages).

* cited by examiner

*Primary Examiner*—Edna Wong
(74) *Attorney, Agent, or Firm*—Senniger Powers

(57) ABSTRACT

A method for electroplating a copper deposit onto a semiconductor integrated circuit device substrate having submicron-sized features, and a concentrate for forming a corresponding electroplating bath. A substrate is immersed into an electroplating bath formed from the concentrate including ionic copper and an effective amount of a defect reducing agent, and electroplating the copper deposit from the bath onto the substrate to fill the submicron-sized reliefs. The occurrence of protrusion defects from superfilling, surface roughness, and voiding due to uneven growth are reduced, and macro-scale planarity across the wafer is improved.

21 Claims, 6 Drawing Sheets

0 ml/L 1.5 ml/L 2.0 ml/L 5.0 ml/L

DEFECT REDUCTION IN ELECTRODEPOSITED COPPER FOR SEMICONDUCTOR APPLICATIONS

BACKGROUND OF THE INVENTION

This invention relates to a method, compositions, and additives for electrolytic copper metallization of silicon wafers in the manufacture of semiconductor integrated circuit (IC) devices.

The demand for manufacturing semiconductor IC devices such as computer chips with high circuit speed, high packing density and low power dissipation requires the downward scaling of feature sizes in ultra-large-scale integration (ULSI) and very-large-scale integration (VLSI) structures. The trend to smaller chip sizes and increased circuit density requires the miniaturization of interconnect features which severely penalizes the overall performance of the structure because of increasing interconnect resistance and reliability concerns such as electromigration.

Traditionally, such structures had used aluminum and aluminum alloys as the metallization on silicon wafers with silicon dioxide being the dielectric material. In general, openings are formed in the dielectric layer in the shape of vias and trenches after metallization to form the interconnects. Increased miniaturization is reducing the openings to submicron sizes (e.g., 0.5 micron and lower).

To achieve further miniaturization of the device, copper has been introduced instead of aluminum as the metal to form the connection lines and interconnects in the chip. Copper metallization is carried out after forming the interconnects. Copper has a lower resistivity than aluminum and the thickness of a copper line for the same resistance can be thinner than that of an aluminum line. Copper-based interconnects therefore represent the future trend in the fabrication of such devices.

Copper can be deposited on substrates by plating (such as electroless and electrolytic), sputtering, plasma vapor deposition (PVD), and chemical vapor deposition (CVD). It is generally recognized electrochemical deposition is the best method to apply copper to the device since it can provide high deposition rates and low tool costs. However, plating methods must meet the stringent requirements of the semiconductor industry. For example, the copper deposits must be uniform and capable of flawlessly filling the extremely small trenches and vias of the device. The plating process must also be capable of being controlled so that process variation is minimized. The deposition of copper from acid copper baths is recognized in the electronics industry as the leading candidate to copper plate integrated circuit devices.

Copper electroplating, in general, involves deposition of a copper layer onto a surface by means of electrolysis using a consumable copper electrode or an insoluble anode.

Regardless of the method used to deposit copper on the substrate surface impurities may be co-deposited with the copper and other morphological defects introduced. In IC fabrication it is important that impurity particles not be present in the electrolyte but such impurities may result from anode sludges formed during the plating operation.

Other micro-defects which adversely affect conductivity in deposited copper result from internal voiding and voiding attributable to detachment of the deposited copper from the walls of features including vias and trenches.

SUMMARY OF THE INVENTION

It is an object of the invention, therefore, to provide a method and compositions for electroplating copper to fill submicron-sized features of integrated circuit devices with fewer defects and improved surface morphology.

Briefly, therefore, the invention is direct to a method for electroplating a copper deposit onto a semiconductor integrated circuit device substrate having submicron-sized features. The method involves immersing the substrate into an electroplating bath including ionic copper and an effective amount of a defect reducing agent; and electroplating the copper deposit from the bath onto the substrate to fill the submicron-sized reliefs. The occurrence of protrusion defects from superfilling, surface roughness, and voiding due to uneven growth are reduced, and macro-scale planarity across the wafer is improved.

In another aspect, the invention is directed to a concentrate for preparation of a copper electroplating bath for electroplating a copper deposit onto a semiconductor integrated circuit device substrate having submicron-sized features. The concentrate has a defect reducing agent which reduces the occurrence of protrusion defects from superfilling, surface roughness, and voiding due to uneven growth, and improves macro-scale planarity across the wafer.

DETAILED DESCRIPTION OF THE PREFERRED EMBODIMENT

In accordance with this invention, a compound is incorporated into the plating bath which has the effect of reducing formation of micro-defects. Certain defects in deposited copper can occur due to locally uneven growth of copper crystals. Other defects formed after deposition, applicants believe, can be attributed to recrystallization and grain growth in the deposit. In particular, there are changes in volume resulting from grain growth, which changes in volume produce stress-induced defects. These volume changes also cause a degree of detachment of the deposit from the via and trench walls, which constitute defects. And recrystallization causes spontaneous internal voids as grain boundaries are eliminated.

Superfilling is rapid bottom up deposition within the features which is created by a two additive system consisting of a suppressor and accelerator. Generally the bottom-up filling created by a two-part system tends to form a bump or protruding surface defect over the features. The present invention involves a third component which inhibits the formation of this type of defect. The mechanism of this inhibition is based on leveling achieved by a stronger suppression of deposition in the areas of accelerated growth rate.

Not all agents which are capable of this leveling suppression reduce multiple types of defects as described herein. Certain classes of compounds have been identified herein to reduce multiple types of defects.

It has also been observed that these leveling compounds added to the plating bath have an effect of decreasing voiding by inhibiting, or at least slowing the rate of, recrystallization in the deposit. The defect reducer component of the invention is either an aliphatic polyamine or a polymeric nitrogen heterocyclic. In either case it is selected from such compounds which are soluble in a copper plating bath, retain their functionality under electrolytic conditions, and do not yield deleterious by-products under electrolytic conditions, at least neither immediately nor shortly thereafter.

One example of a suitable defect reducing agent is a reaction product of benzyl chloride and hydroxyethyl polyethyleneimine (available under the tradename Lupasol SC 61B from BASF Corporation of Rensselear, N.Y.).

Another suitable defect reducing agent is a reaction product of benzyl chloride and polyethyleneimine.

A further suitable defect reducing agent is the reaction product of 1-chloromethylnaphthalene and hydroxyethyl polyethyleneimine (available under the tradename Lupasol SC 61B from BASF Corporation of Rensselear, N.Y.). Polyvinylpyridines and their quaternized salts, and polyvinylimidazole and its salts are also suitable.

Figure 1:
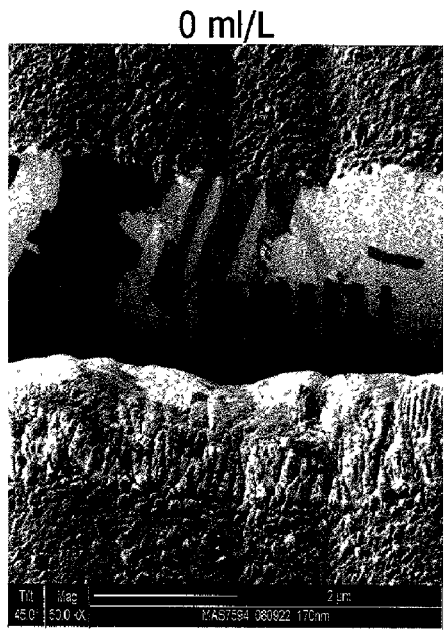
FIGS. 1-4 are 50,000× photomicrographs of four cross sections of copper deposits with the amount of defect reducing agent increasing from 0 ml/L to 1.5 ml/L to 2.0 ml/L to 5.0 ml/L.
Figure 2:
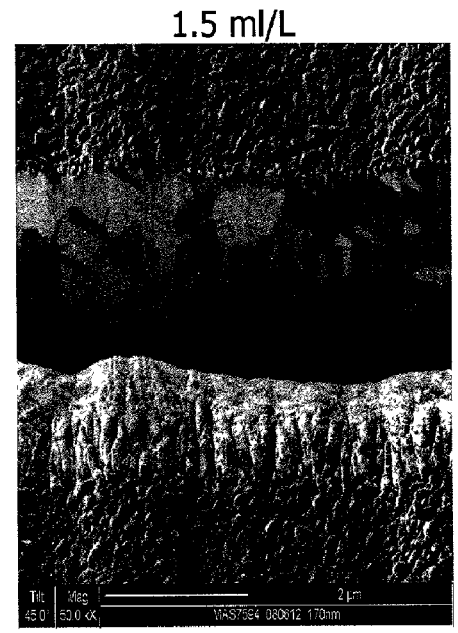
Figure 3:
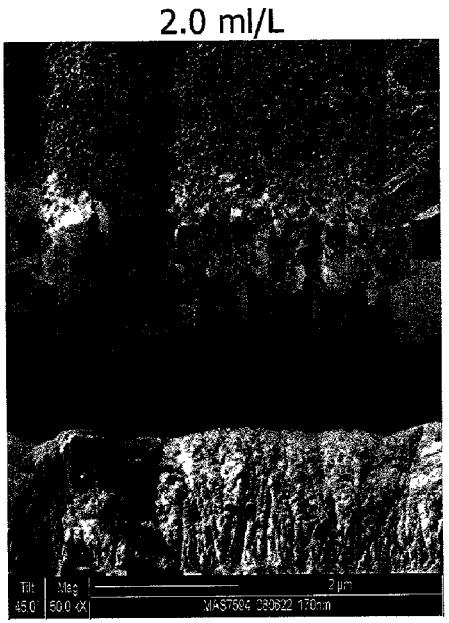
Figure 4:
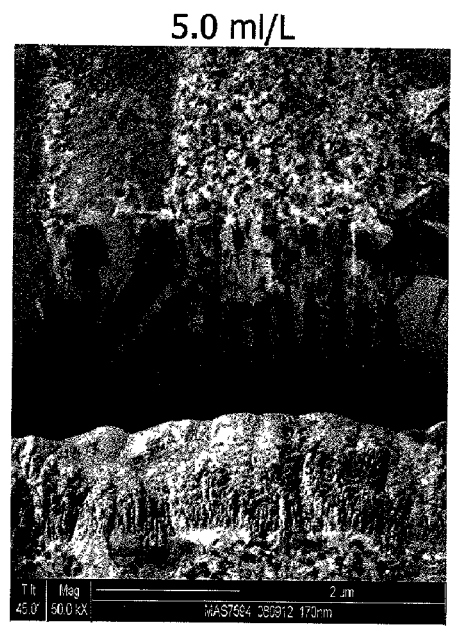
Figure 5:
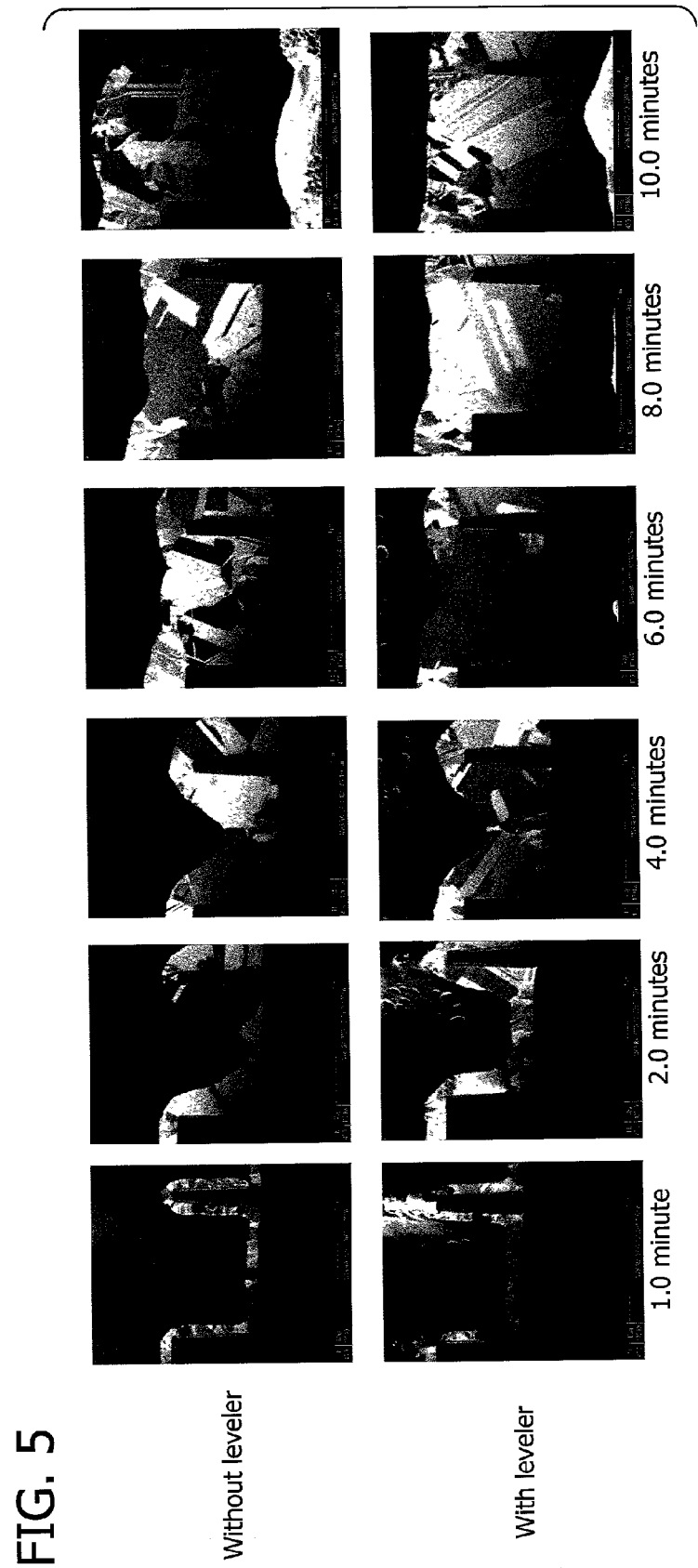
FIGS. 5 and 6 are 120,000× photomicrographs of a cross section of a copper deposit taken at successive intervals during deposition.
Figure 6:
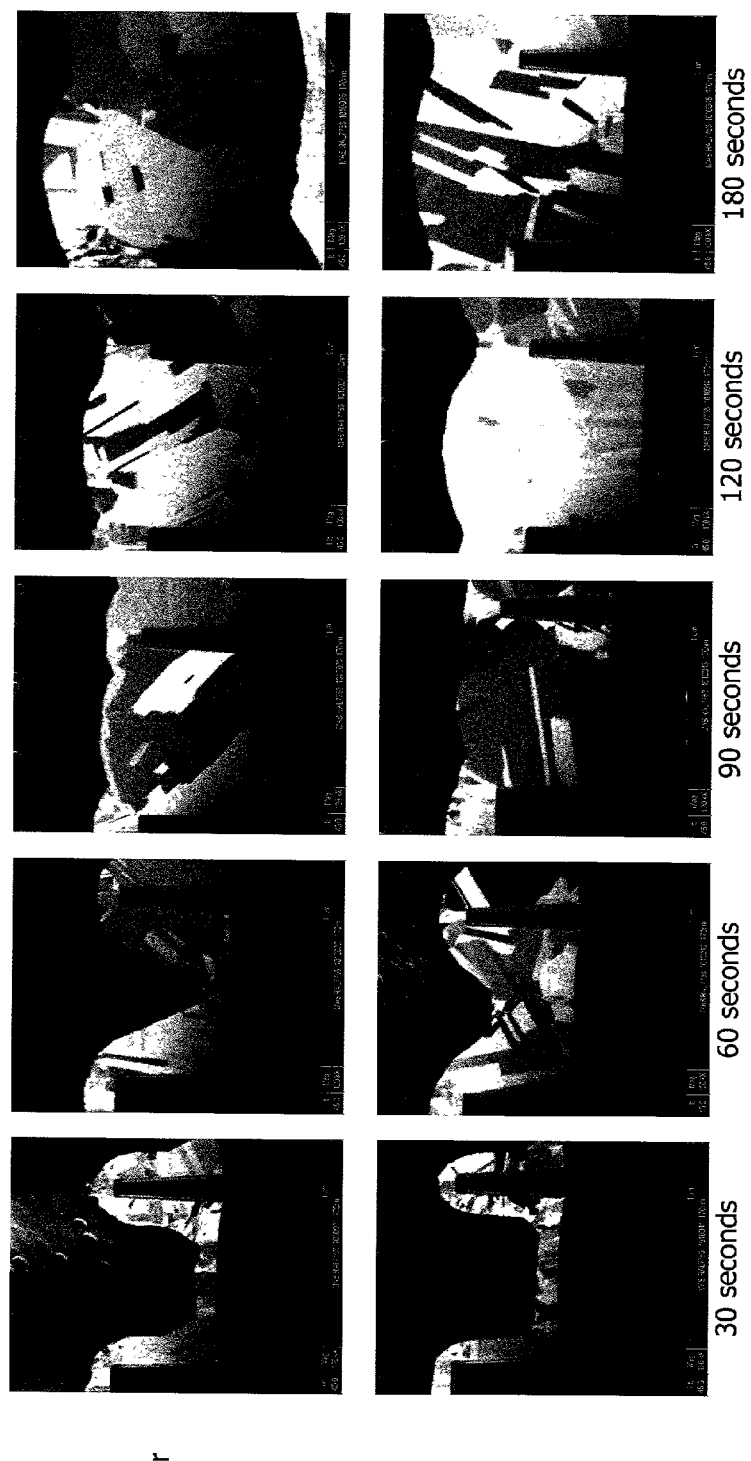
Figure 7:
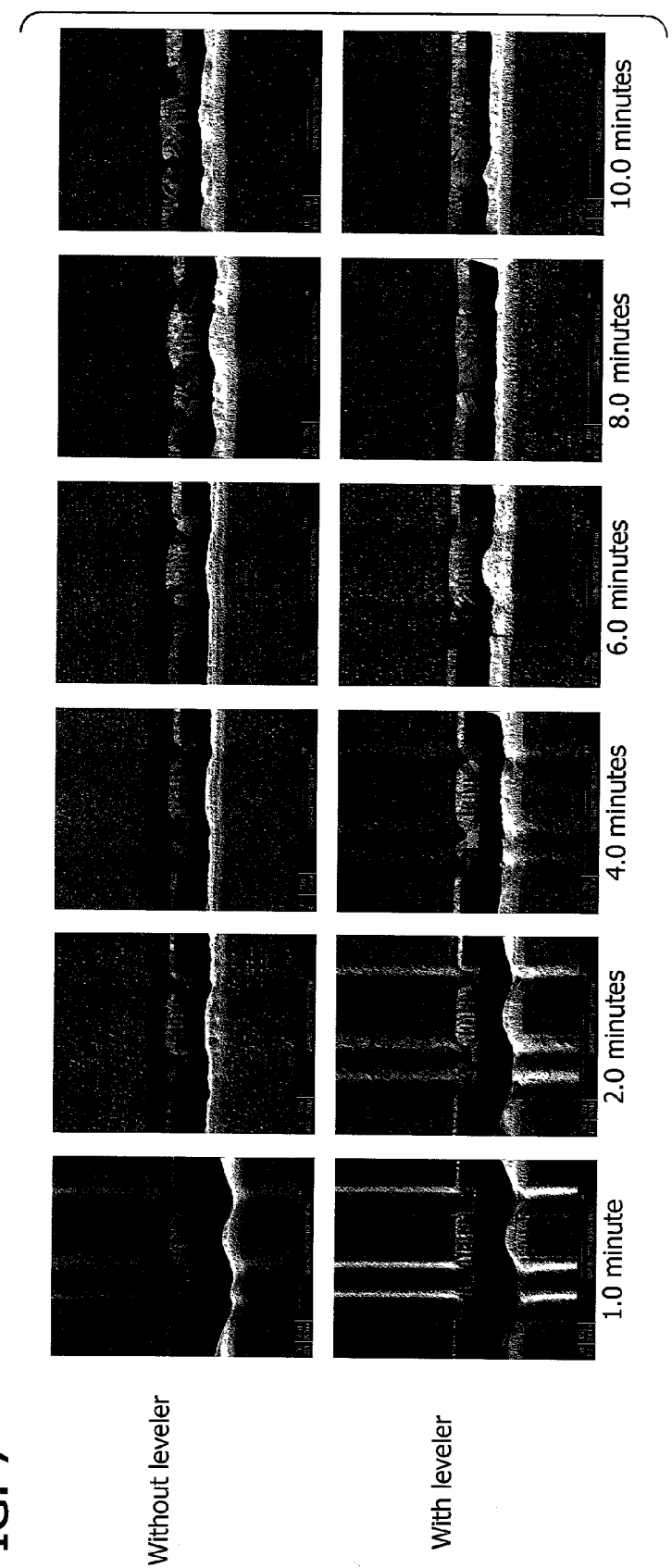
FIGS. 7 and 8 are 25,000× photomicrographs of a cross section of a copper deposit taken at successive intervals during deposition.
Figure 8:
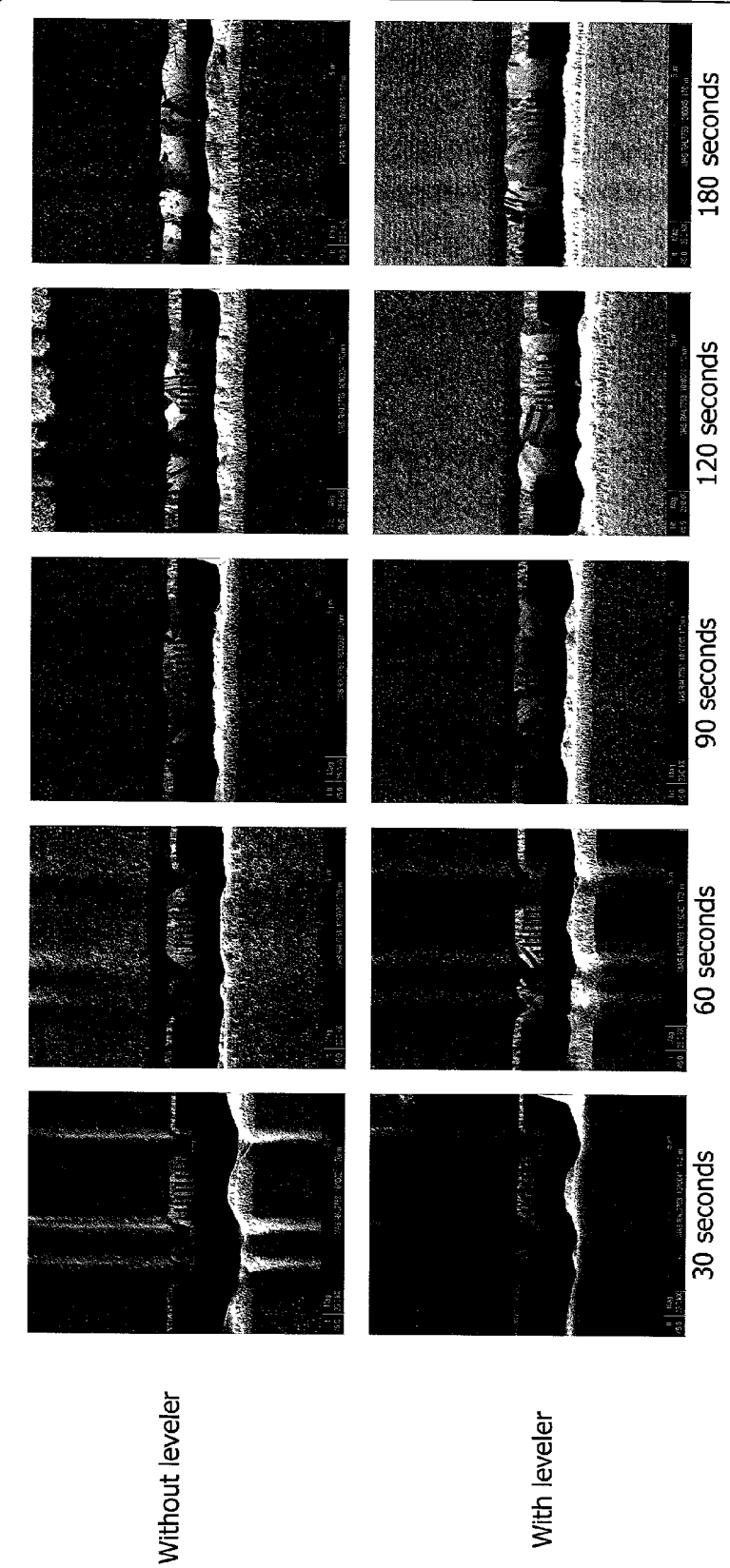

As noted above, the defect reducer of the invention has an effect of decreasing voiding by inhibiting, or at least slowing the rate of, recrystallization in the deposit. After annealing, and even in the absence of a specific elevated temperature annealing operation, individual grains in deposited copper have a tendency to recrystallize and grow. FIG. 1 illustrates this grain growth, as large grains can be seen in the cross-section of the deposit plated without the defect reducing agent of the invention. As can be seen in FIGS. 2, 3, and 4, the addition of the defect-reducing agent of the invention in increasing amounts slows the formation of the larger grains. The deposits in these figures were made with 1.5 ml/L, 2.0 ml/L, and 5.0 ml/L, respectively, of the defect reducer of the invention in the bath. By slowing the rate of recrystallization and grain growth, it is believed that internal stresses during recrystallization and grain growth are reduced, which stresses tend to manifest themselves as internal voids. Thus, overall internal voiding is reduced.

An aspect of the defect reducing agent of the invention is that it increases the overall chloride content of the copper deposit as compared to the chloride content of a deposit made under identical conditions without the agent. The overall chloride content of the deposit employing the agent of the invention is, for example, at least about $2.0 \times 10^{19}$ atom/cm$^3$. In a different embodiment, the overall chloride content of the deposit employing the agent of the invention is, for example, at least about $4.0 \times 10^{19}$ atom/cm$^3$ as compared to a deposit made under identical conditions without the agent which has less than about $1.5 \times 10^{19}$ atom/cm$^3$. In one embodiment, the overall chloride content of the deposit is between about $4.0 \times 10^{19}$ atom/cm$^3$ and about $25 \times 10^{19}$ atom/cm$^3$. In another embodiment, the elevated chloride content is greater than about $1 \times 10^{19}$ atom/cm$^3$, which is greater than in a comparable deposit under the same conditions without the agent. Experimental results reveal that including 2.0 ml/L of defect reducing agent in an electroplating bath increased the chloride content from $0.34 \times 10^{19}$ atom/cm$^3$ without the agent to $5.18 \times 10^{19}$ atom/cm$^3$ with the agent. In other baths with different bath compositions and different deposition parameters, including 2.0 ml/L of defect reducing agent in the bath increased the chloride content from $1.07 \times 10^{19}$ atom/cm$^3$ without the agent to $18.0 \times 10^{19}$ atom/cm$^3$ with the agent, and from $0.17 \times 10^{19}$ atom/cm$^3$ without the agent to $11.6 \times 10^{19}$ atom/cm$^3$ with the agent. In still other baths with different bath compositions and different deposition parameters, including 1.0 ml/L of defect reducing agent in the bath increased the chloride content from about $0.1 \times 10^{19}$ atom/cm$^3$ without the agent to $0.9 \times 10^{19}$ atom/cm$^3$, $1.0 \times 10^{19}$ atom/cm$^3$, $1.0 \times 10^{19}$ atom/cm$^3$ $1.2 \times 10^{19}$ atom/cm$^3$, and $3.0 \times 10^{19}$ atom/cm$^3$ with the agent in separate experiments.

In another aspect the defect reducing agent of the invention was observed to increase the overall nitrogen content of the copper deposit as compared to a deposit made under identical conditions without the agent. The overall nitrogen content of the deposit using the defect reducing agent of the invention is, for example, at least about $1.0 \times 10^{18}$ atom/cm$^3$. In one embodiment, the overall nitrogen content of the deposit is between about $1.0 \times 10^{18}$ atom/cm$^3$ and about $4.0 \times 10^{18}$ atom/cm$^3$. Experimental results reveal that including 2.0 ml/L of defect reducing agent in an electroplating bath increased the nitrogen content from $0.13 \times 10^{18}$ atom/cm$^3$ without the agent to $1.11 \times 10^{18}$ atom/cm$^3$ with the agent. In other baths with different bath compositions and different deposition parameters, including 2.0 ml/L of defect reducing agent in the bath increased the nitrogen content from $0.53 \times 10^{18}$ atom/cm$^3$ without the agent to $4.81 \times 10^{18}$ atom/cm$^3$ with the agent, and from $0.21 \times 10^{18}$ atom/cm$^3$ without the agent to $2.13 \times 10^{18}$ atom/cm$^3$ with the agent.

The defect reducing agent of the invention also is believed to increase the overall sulfur content of the copper deposit as compared to a deposit made under identical conditions without the agent. The overall sulfur content of the deposit is, for example, at least about $3.0 \times 10^{18}$ atom/cm$^3$. In one embodiment, the overall sulfur content of the deposit is between about $3.0 \times 10^{18}$ atom/cm$^3$ and about $15.0 \times 10^{18}$ atom/cm$^3$. In still another embodiment, the overall sulfur content of the deposit is at least about $1.5 \times 10^{18}$ atom/cm$^3$ as compared to less than about $1.0 \times 10^{18}$ atom/cm$^3$ for a deposit made under identical conditions without the agent. Experimental results reveal that including 2.0 ml/L of defect reducing agent in an electroplating bath increased the sulfur content from $0.38 \times 10^{18}$ atom/cm$^3$ without the agent to $3.72 \times 10^{18}$ atom/cm$^3$ with the agent. In other baths with different bath compositions and different deposition parameters, including 2.0 ml/L of defect reducing agent in the bath increased the sulfur content from $1.72 \times 10^{18}$ atom/cm$^3$ without the agent to $13.2 \times 10^{18}$ atom/cm$^3$ with the agent, and from $0.48 \times 10^{18}$ atom/cm$^3$ without the agent to $8.12 \times 10^{18}$ atom/cm$^3$ with the agent. In other baths with different bath compositions and different deposition parameters, including 1.0 ml/L of defect reducing agent in the bath increased the sulfur content from $0.8 \times 10^{18}$ atom/cm$^3$ without the agent to $1.5 \times 10^{18}$ atom/cm$^3$, $2.5 \times 10^{18}$ atom/cm$^3$, $2.5 \times 10^{18}$ atom/cm$^3$, and $2.5 \times 10^{18}$ atom/cm$^3$ with the agent.

The compounds of the invention have the advantage of leveling. In particular, deposited metal tends to follow, and in fact amplify, changes in elevation corresponding to features on the substrate, as illustrated in FIGS. 5-8. The compounds of the invention have a leveling effect on the deposit, as illustrated in FIGS. 5-8 where the upper series in each figure illustrate surface perturbations in the deposit over features on a wafer without using the defect reducer and leveler of the invention. The lower series of photomicrographs in each figure, in contrast, illustrate much milder perturbations, an effect which is driven by the greater adsorption of the defect reducer that slows down the deposition in these locations. In those areas where the surface topography is relieved due to the presence of a trench, relatively more copper is deposited onto such relieved surface areas than onto unrelieved surface areas. This yields an overall copper deposit surface which is more level than a comparable overall deposit surface electroplated without the defect reducing agent. With this more level deposit, the size of the overall deposit is reduced, as the features are filled in a more level manner. Relatively more copper is deposited onto relieved surface areas than onto unrelieved surface areas, such that the overall deposit is more level than an overall deposit surface electroplated without the defect reducing agent. There are therefore savings in terms of the amount of metal to be deposited and, perhaps more significantly, in terms of deposition time to fill the features. The overall deposit thickness to achieve a minimum thickness at all locations of the deposit is therefore thinner than an overall deposit required to achieve the same minimum thickness by electroplating without the defect reducing agent.

In addition, due to the relatively high resistance from the copper seed layer that carries the current from the edge to the center of the wafer for deposition, the copper deposit is thicker on the edge. By using the defect reducing agent the distribution of the deposited copper over the substrate surface is improved. In one embodiment, the deposit thickness is about 1 micron, and the thickness varies by no more than 0.1 micron across the deposit, the deposit thickness being measured from the upper surface of the deposit to the substrate surface at its thickest point.

A further significant advantage of this leveling effect is that less material has to be removed in post-deposition operations. For example, chemical mechanical polishing (CMP) is used to reveal the underlying features. The more level deposit of the invention corresponds to a reduction in the amount of metal which must be deposited, therefore resulting in less removal later by CMP. There is a reduction in the amount of scrapped metal and, more significantly, a reduction in the time required for the CMP operation. The material removal operation is also less severe which, coupled with the reduced duration, corresponds to a reduction in the tendency of the material removal operation to impart defects.

A feature of the invention is that what is known as high current density edge effect is reduced. In particular, there is a tendency for burning to occur at the edge of a substrate where current density is highest, which burning detracts from brightness and reduces yield. The defect reducer and leveler of the invention reduces this effect.

Figure 9:
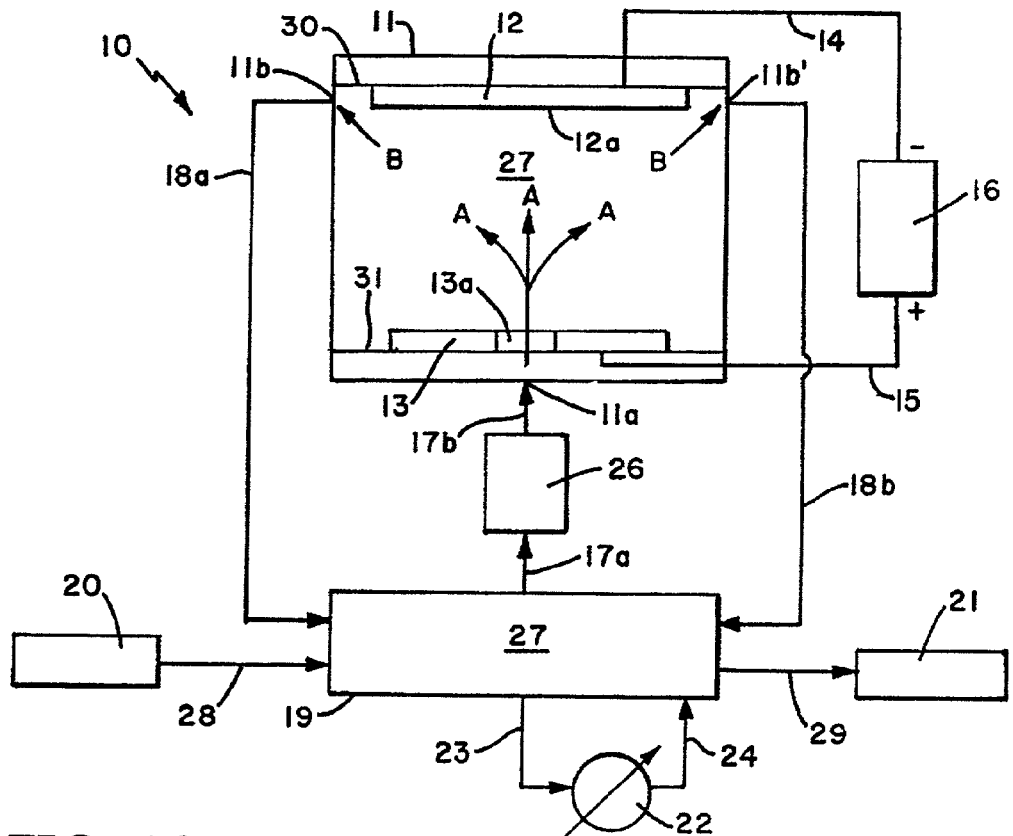
FIGS. 9 and 10 are schematic representations of alternative plating systems for carrying out the method of the invention.

Referring to FIG. 9, a preferred plating system is shown generally as 10 and is used for electroplating copper onto a substrate 12. The plating system 10 and method are described with reference to plating a silicon wafer using an insoluble anode but it will be appreciated by those skilled in the art that other substrates may be plated.

The preferred plating system 10 comprises an electroplating tank 11 (also known as the holding tank) which holds copper electrolyte 27 and which is made of a suitable material such as plastic or other material inert to the electrolytic plating solution. The tank is preferably cylindrical especially for wafer plating. A cathode 12 is horizontally disposed at the upper part of tank 11 and may be any type substrate such as a silicon wafer having openings such as trenches and vias. The wafer substrate 12a is typically coated with a seed layer of copper or other metal to initiate plating thereon. A copper seed layer may be applied by CVD, PVD, or the like. An anode 13 is also preferably circular for wafer plating and is horizontally disposed at the lower part of tank 11 forming a space between the anode 13 and cathode 12. The anode 13 is typically a soluble anode, but may also be an insoluble anode which is not consumed in the process.

The cathode substrate 12 and anode 13 are electrically connected by wiring 14 and 15, respectively, to a rectifier (power supply) 16. The cathode substrate 12 for direct or pulse current has a net negative charge so that copper ions in the solution are reduced at the cathode substrate forming plated copper metal on the cathode surface 12a. An oxidation reaction takes place at anode 13. The cathode 12 and anode 13 are shown horizontally disposed but may also be vertically disposed in the tank 11.

An electrolyte holding tank 19 contains copper electrolyte 27 which is recycled from holding tank 19 through line 17a, filter 26 and line 17b to the inlet 11a of electroplating tank 11. The electrolyte 27 as it enters the tank moves through an opening 13a in anode 13 and moves as shown by arrows A upward to the outlets 11b and 11b' of electroplating tank 11. The anode is positioned on plate 31. Arrows B show electrolyte being removed from holding tank 11 through outlets 11b and 11b' into recycle transfer lines 18a and 18b. It is preferred that outlets 11b and 11b' be proximate the edge of surface 12a of cathode 12 and more preferred that the outlet be a continuous opening around the periphery of the electroplating tank so that the flow of electrolyte impinging on the cathode surface is uniform across the cathode surface and the electrolyte overflows the opening and is directed to holding tank 19 for recycle. The electrolyte thus flows through the opening 13a in anode 13 and flows upward through tank 11 and impinges on cathode 12 as it exits the tank 11. A flange or plate 30 holds cathode 12 in position. As shown in the figure, electrolyte contacts only the upper side of anode 13 and only the lower side 12a of cathode 12. The outlet electrolyte is recycled to holding tank 19. During operation of the plating system to plate cathode substrate 12 with a layer of copper, the electrolyte 27 is preferably continuously recycled through holding tank 19 and electroplating tank 11. This forms a substantially uniform electrolyte composition in the system and contributes to the overall effectiveness of the substrate plating.

The copper electroplating bath may vary widely depending on the substrate to be plated and the type copper deposit desired. An acid bath is preferred and an exemplary copper plating bath because of its demonstrated effectiveness has a copper ion concentration of about 15 to 19 g/l and a copper sulfate concentration as the pentahydrate of 59 to 75 g/l. Sulfuric acid is present in an amount of about 150 to 225 g/l. Chloride ion may also be used in the bath at a level up to 90 mg/l. The bath also preferably contains an organic additive system such as accelerator, suppressor, and other defect reducer.

During operation of the electroplating system 10, copper metal is plated on surface 12a of cathode substrate 12 when the rectifier 16 is energized. A pulse current, direct current, reverse periodic current or other suitable current may be employed. The temperature of the electrolyte may be maintained using a heater/cooler 22 whereby electrolyte 27 is removed from holding tank 19 and flows through line 23, heater/cooler 22 and then recycled to holding tank 19 through line 24.

It is an optional feature of the process that the plating system be controlled as described in U.S. Pat. No. 6,024,856 by removing a portion of the electrolyte from the system when a predetermined operating parameter (condition) is met and new electrolyte is added to the system either simultaneously or after the removal in substantially the same amount. The new electrolyte is preferably a single liquid containing all the materials needed to maintain the electroplating bath and system. The addition/removal system maintains a steady-state constant plating system having enhanced plating effects such as constant plating properties. With this system and method the plating bath reaches a steady state where bath components are substantially a steady-state value. It is preferred that the concentration of copper in the electrolyte be maintained within about 3 g/l, preferably 2 g/l and most preferably 1 g/l or less of the desired copper concentration for wafer plating processes. The copper used to make the electrolyte and the copper containing solution is preferably copper sulfate.

Figure 10:
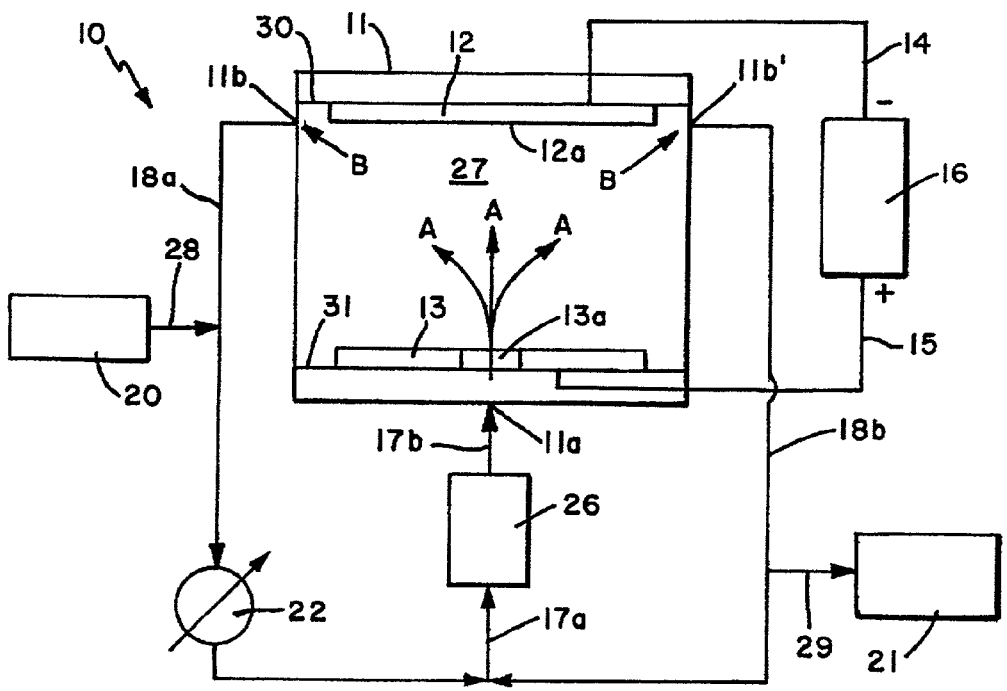

Referring now to FIG. 10, which shows another plating system 10, the plating system 10 is similar to the plating system of FIG. 9 except that a holding tank 19 is not employed. Thus, an electroplating tank 11 has therein a horizontally disposed cathode 12 and anode 13 separated by a space. Electrolyte 27 in the tank is circulated through the tank and removed through outlet lines 18a and 18b. The outlet from the tank is recycled to the inlet of the tank through line 17a, filter 26 and line 17b into tank 11 at inlet 11a. The flow of electrolyte 27 into the tank is shown by arrows A and electrolyte flow to outlets 11b and 11b' past cathode 12 as shown by arrows B. Anode 13 has a central opening 13a.

When a predetermined operating parameter is reached, electrolyte 27 is removed from the apparatus through line 29 into tank or container 21 and a copper containing solution in tank 20 is fed into outlet line 18a through line 28. A heater or cooler 22 is shown employed in line 18a.

The invention may be practiced using a large variety of copper baths. The electrolytic baths include acid baths and alkaline baths. A variety of copper electroplating baths are described in the book entitled Modern Electroplating, edited by F. A. Lowenheim, John Reily & Sons, Inc., 1974, pages 183-203. Exemplary baths include copper fluoborate, copper pyrophosphate, copper cyanide, copper phosphonate and other copper metal complexes such as methane sulfonic acid and the preferred copper electroplating bath comprises copper sulfate in an acid solution. The concentration of copper and acid may vary over wide limits. For copper or copper ions, compositions generally vary from on the order of 10 g/L to on the order of 50 g/L, and even up to saturation, depending on the acid concentration. For example, in one embodiment the copper ion concentration is about 17 g/L where the $H_2SO_4$ concentration is about 180 g/L. In another embodiment, the Cu concentration is about 40 g/L where the $H_2SO_4$ concentration is about 10 g/L. The acid solution is typically sulfuric acid in an amount up to about 300 g/l. Chloride ions may be used in the bath at levels up to about 200 mg/l.

A large variety of additives are typically used in the bath to provide desired surface finishes for the copper plated metal. Usually more than one additive is used with each additive forming a desired function. The additives are generally used to initiate bottom-up filling of interconnect features as well as for improved metal plated appearance (brightness), structure and physical properties such as electrical conductivity. Particular additives (usually organic additives) are used for grain refinement, suppression of dendritic growth and improved covering and throwing power. Typical additives used in electroplating are discussed in a number of references including Modern Electroplating, cited above. A particularly desirable additive system uses a mixture of aromatic or aliphatic quaternary amines, polysulfide compounds, polyimines and polyethers. Other additives include metaloids such as selenium, tellurium and sulfur compounds.

Electrolysis conditions such as electric current concentration, applied voltage, electric current density, and electrolyte temperature are essentially the same as those in conventional electrolytic copper plating methods. For example, the bath temperature is typically about room temperature such as about 20-27 C., but may be at elevated temperatures up to about 40 C. or higher. The current density is typically up to about 100 amps per square foot (ASF) typically about 2 to 40 ASF. It is preferred to use an anode to cathode ratio of about 1:1, but this may also vary widely from about 1:4 to 4:1. The process also uses mixing in the electroplating tank which may be supplied by agitation or preferably by the circulating flow of recycle electrolyte through the tank. In the preferred apparatus as shown in the Figures, the flow through the electroplating tank provides a residence time of electrolyte in the tank of less than about 1 minute typically less than 30 seconds, e.g., 10-20 seconds.

The foregoing relates only to a limited number of embodiments that have been provided for illustration purposes only. It is intended that the scope of invention is defined by the appended claims and that modifications to the embodiments above may be made that do not depart from the scope of the invention.

The invention claimed is:

1. A method for electroplating a copper deposit onto a semiconductor integrated circuit device substrate with electrical interconnect features including submicron-sized features such that the surface has submicron-sized reliefs therein, the method comprising:
    immersing the semiconductor integrated circuit device substrate into an electroplating bath including ionic copper, a suppressor, an accelerator, and an effective amount of a defect reducing agent to increase an overall chloride content and an overall sulfur content of the copper deposit, wherein the defect reducing agent is a reaction product of benzyl chloride and hydroxyethyl polyethylenimine; and
    electroplating the copper deposit from said bath onto the substrate to superfill the submicron-sized reliefs by rapid bottom up deposition within the reliefs whereby the occurrence of protrusion defects from superfilling, surface roughness, and voiding due to uneven growth are reduced, and macro-scale planarity across the semiconductor integrated circuit device substrate is improved.

2. The method of claim 1 wherein the defect reducing agent reduces high current density edge effect during the electroplating.

3. The method of claim 1 wherein the defect reducing agent improves distribution of deposited copper over the substrate surface.

4. The method of claim 1 wherein the deposit has a deposit thickness of about 1 micron and which varies by no more than about 0.2 microns across the deposit, the deposit thickness being measured from an upper surface of the deposit to the substrate surface at its thickest point.

5. The method of claim 1 wherein the defect reducing agent facilitates deposition of a thinner overall deposit to achieve a minimum thickness across the substrate than an overall deposit required to achieve such minimum thickness by electroplating without said defect reducing agent.

6. The method of claim 1 further comprising removing a portion of the copper deposit by chemical and mechanical action to yield a level substrate, wherein an amount of copper deposit to be removed is less than an amount of copper deposit which must be removed by chemical and mechanical action to yield a level substrate in a comparable substrate electroplated without said defect reducing agent.

7. The method of claim 6 wherein pitting corrosion from said chemical action is less severe than pitting corrosion in the comparable substrate electroplated without said defect reducing agent.

8. The method of claim 1 wherein the electroplating bath further includes sulfuric acid present in an amount between about 150 g/L and about 225 g/L.

9. The method as set forth in claim 8 wherein the electroplating bath comprises copper ion in a proportion between about 50 g/L and saturation as the ionic copper.

10. The method as set forth in claim 8 wherein the electroplating bath comprises on the order of 10 g/L to on the order of 50 g/L copper ions as the ionic copper.

11. The method as set forth in claim 8 wherein the electroplating bath comprises a copper sulfate concentration as the pentahydrate of 59 to 75 g/L as a source of the ionic copper.

12. The method of claim 1 wherein a source of the ionic copper is copper sulfate pentahydrate present in an amount between about 59 g/L and about 75 g/L.

13. The method of claim 1 wherein the electroplating bath comprises 1.0 mL/L of said defect reducing agent.

14. The method of claim 1 wherein the electroplating bath comprises 2.0 mL/L of said defect reducing agent.

15. The method of claim 1 wherein the electroplating bath comprises 5.0 mL/L of said defect reducing agent.

16. The method of claim 1 wherein said overall sulfur content in the copper deposit is at least about $1.5 \times 10^{18}$ atoms/cm$^3$.

17. The method of claim 1 wherein said overall sulfur content in the copper deposit is at least about $3.0 \times 10^{18}$ atoms/cm$^3$.

18. The method of claim 1 wherein the semiconductor integrated circuit device substrate is a silicon wafer.

19. A method for electroplating a copper deposit onto a semiconductor integrated circuit device substrate having electrical interconnect features including submicron-sized features such that the surface has submicron-sized reliefs therein, the method comprising:

immersing the semiconductor integrated circuit device substrate into an electroplating bath including ionic copper, a suppressor, an accelerator, and an effective amount of a defect reducing agent which (a) reduces a rate of recrystallization and grain growth in the copper deposit, thereby reducing the formation of internal voids within the copper deposit and (b) increases a chloride content and a sulfur content of the copper deposit as compared to a chloride content and a sulfur content of a copper deposit from a comparable electroplating bath not containing the defect reducing agent; and electroplating the copper deposit from said bath onto the semiconductor integrated circuit device substrate to superfill the submicron-sized reliefs by rapid bottom up deposition within the reliefs, which deposit subsequently undergoes said recrystallization and grain growth at said reduced rate and thereby is characterized by a reduced concentration of internal voids;

wherein the defect reducing agent is a reaction product of benzyl chloride and hydroxyethyl polyethylenimine.

20. The method of claim 19 wherein an overall sulfur content in the copper deposit is at least about $1.5 \times 10^{18}$ atoms/cm$^3$.

21. The method of claim 19 wherein an overall sulfur content in the copper deposit is at least about $3.0 \times 10^{18}$ atoms/cm$^3$.

* * * * *